(12) United States Patent
Furukawa et al.

(10) Patent No.: US 7,659,171 B2
(45) Date of Patent: Feb. 9, 2010

(54) METHODS AND STRUCTURE FOR FORMING SELF-ALIGNED BORDERLESS CONTACTS FOR STRAIN ENGINEERED LOGIC DEVICES

(75) Inventors: Toshiharu Furukawa, Essex Junction, VT (US); Steven J Holmes, Guilderland, NY (US); David V Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 11/850,172

(22) Filed: Sep. 5, 2007

(65) Prior Publication Data

US 2009/0057730 A1    Mar. 5, 2009

(51) Int. Cl.
*H01L 21/336* (2006.01)
(52) U.S. Cl. .................. 438/299; 438/595; 438/666; 257/E21.438; 257/E29.278
(58) Field of Classification Search .......... 439/299, 439/595, 666; 257/E21.438, E29.278
See application file for complete search history.

(56) References Cited

U.S. PATENT DOCUMENTS

| 7,126,198 | B2 * | 10/2006 | Steiner et al. | 257/412 |
| 2007/0010073 | A1 * | 1/2007 | Chen et al. | 438/486 |
| 2007/0090395 | A1 * | 4/2007 | Sebe et al. | 257/144 |
| 2007/0131972 | A1 * | 6/2007 | Li | 257/213 |

* cited by examiner

*Primary Examiner*—Trung Dang
(74) *Attorney, Agent, or Firm*—Cantor Colburn LLP; Yuanmin Cai (57) ABSTRACT

A method for forming a borderless contact for a semiconductor FET (Field Effect Transistor) device, the method comprising, forming a gate conductor stack on a substrate, forming spacers on the substrate, such that the spacers and the gate conductor stack partially define a volume above the gate conductor stack, wherein the spacers are sized to define the volume such that a stress liner layer deposited on the gate conductor stack substantially fills the volume, depositing a liner layer on the substrate, the spacers, and the gate conductor stack, depositing a dielectric layer on the liner layer, etching to form a contact hole in the dielectric layer, etching to form the contact hole in the liner layer, such that a portion of a source/drain diffusion area formed in the substrate is exposed and depositing contact metal in the contact hole.

17 Claims, 11 Drawing Sheets

METHODS AND STRUCTURE FOR FORMING SELF-ALIGNED BORDERLESS CONTACTS FOR STRAIN ENGINEERED LOGIC DEVICES

BACKGROUND OF THE INVENTION

1. Field of the Invention

This invention relates generally to semiconductor FET (Field Effect Transistor) device fabrication techniques, and particularly to a method and structure for forming self-aligned, borderless contacts for strain-engineered logic devices.

2. Description of Background

Structures in semiconductor devices such as FET devices may be fabricated on silicon wafers. The overlays used in fabrication methods often require a minimum distance border between a source and drain diffusion (S/D) area and a gate conductor to prevent the shorting of the gate conductor to the S/D during the fabrication process. The bordering distance is undesirable because the areas used for the contact borders result in wasted space on the silicon wafer.

Thus, it is desirable to fabricate a self-aligned structure for semiconductor devices that may be easily etched, limits the border distance between structures, and is compatible with nitride stress liners.

SUMMARY OF THE INVENTION

The shortcomings of the prior art are overcome and additional advantages are achieved through a method for forming a borderless contact for a semiconductor FET (Field Effect Transistor) device, the method comprising, forming a gate conductor stack on a substrate, forming spacers on the substrate, such that the spacers and the gate conductor stack partially define a volume above the gate conductor stack, wherein the spacers are sized to define the volume such that a stress liner layer deposited on the gate conductor stack substantially fills the volume, depositing a liner layer on the substrate, the spacers, and the gate conductor stack, depositing a dielectric layer on the liner layer, etching to form a contact hole in the dielectric layer, etching to form the contact hole in the liner layer, such that a portion of a source/drain diffusion area formed in the substrate is exposed and depositing contact metal in the contact hole.

An exemplary embodiment of a borderless contact structure for a semiconductor FET device comprising, a contact area defined on a source/drain diffusion area of a substrate, a gate conductor stack disposed on the substrate, spacers disposed on the substrate and adjacent the gate conductor stack, a volume partially defined by the gate conductor stack and the spacers, a stress liner layer disposed on the contact area, the gate conductor stack, the spacers, and the substrate, wherein the stress liner substantially fills the volume, a dielectric layer disposed on the stress liner layer, a contact hole formed in the dielectric layer and the stress liner layer, wherein the formed contact hole exposes the contact area, and the stress liner layer in the filled volume is operative to prevent the etched contact hole from exposing the gate conductor stack, and a contact metal disposed in the contact hole.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Systems and methods involving self-aligning contact structures are provided. Several exemplary embodiments are described.

Figure 1A:
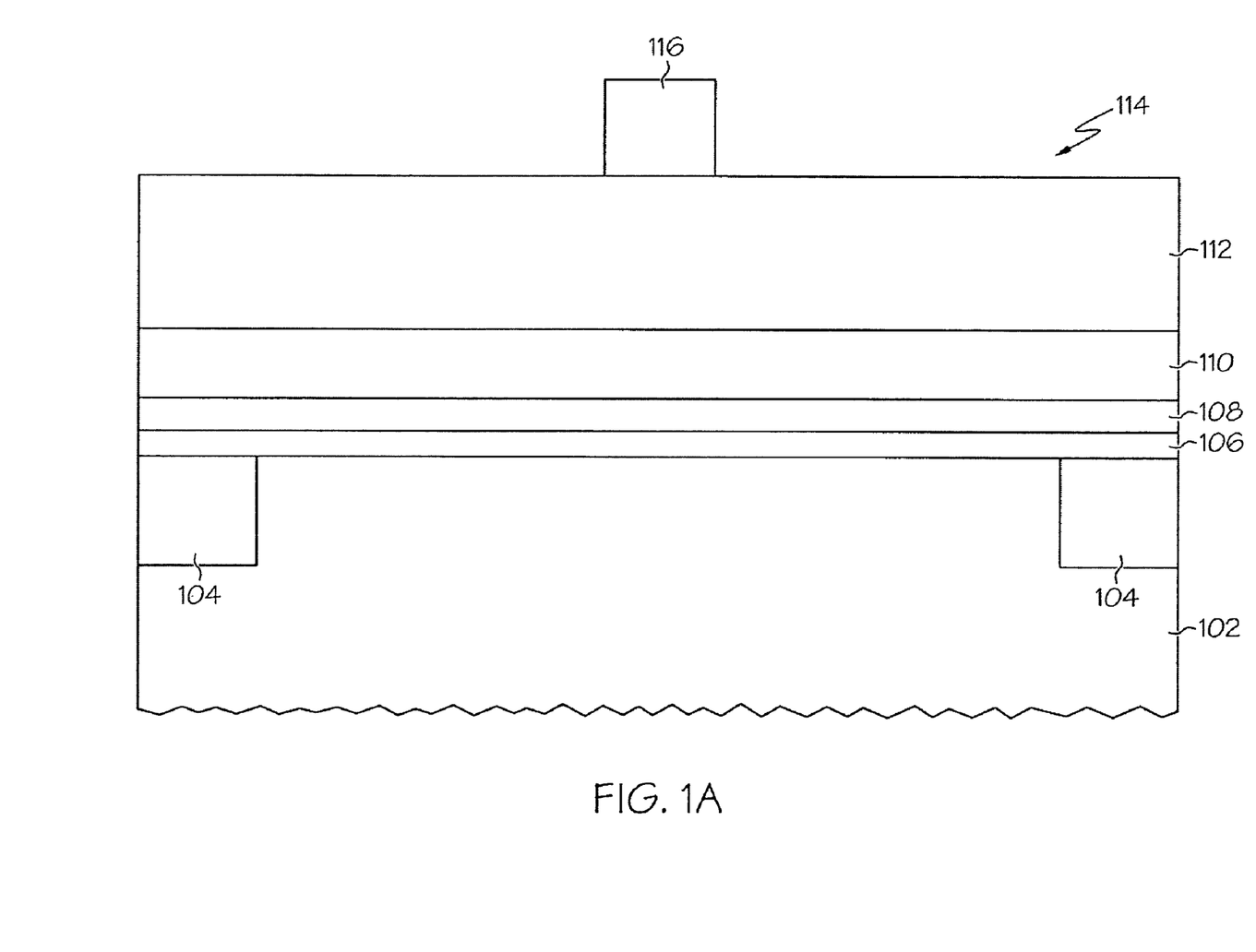
FIGS. 1a-1i illustrate a partially cut-away side view of steps in an exemplary method for fabricating a self-aligned contact structure.

FIGS. 1a-1i illustrate side partially cut-away views of the steps in an exemplary method for forming a self-aligning S/D borderless contact to a gate for a semiconductor FET device. In this regard, FIG. 1a illustrates a substrate 102 including shallow trench isolation (STI) portions 104. In this exemplary embodiment, the substrate may be doped (e.g., p-type) bulk silicon substrate or a silicon-on-insulator (SOI) layer, for example. Following STI formation, a number of layers of materials are deposited over the substrate 102 and the STI 104 that will eventually form a gate stack (not shown in FIG. 1a). A gate dielectric layer 106 comprising silicon dioxide and hafnium oxide, for example, is formed over the substrate 102 and STI 104. A metal gate conductive layer 108 of titanium nitride (approximately 10-30 nm thick), for example, is deposited over the gate dielectric layer 106, and a doped polysilicon layer 110 (approximately 40-100 nm thick) is deposited over the gate conductive layer 108. Finally, a silicon dioxide layer 112 is deposited over the doped polysilicon layer 110. FIG. 1a also illustrates a developed photoresist 114 with a portion 116 that defines the gate stack.

Figure 1B:
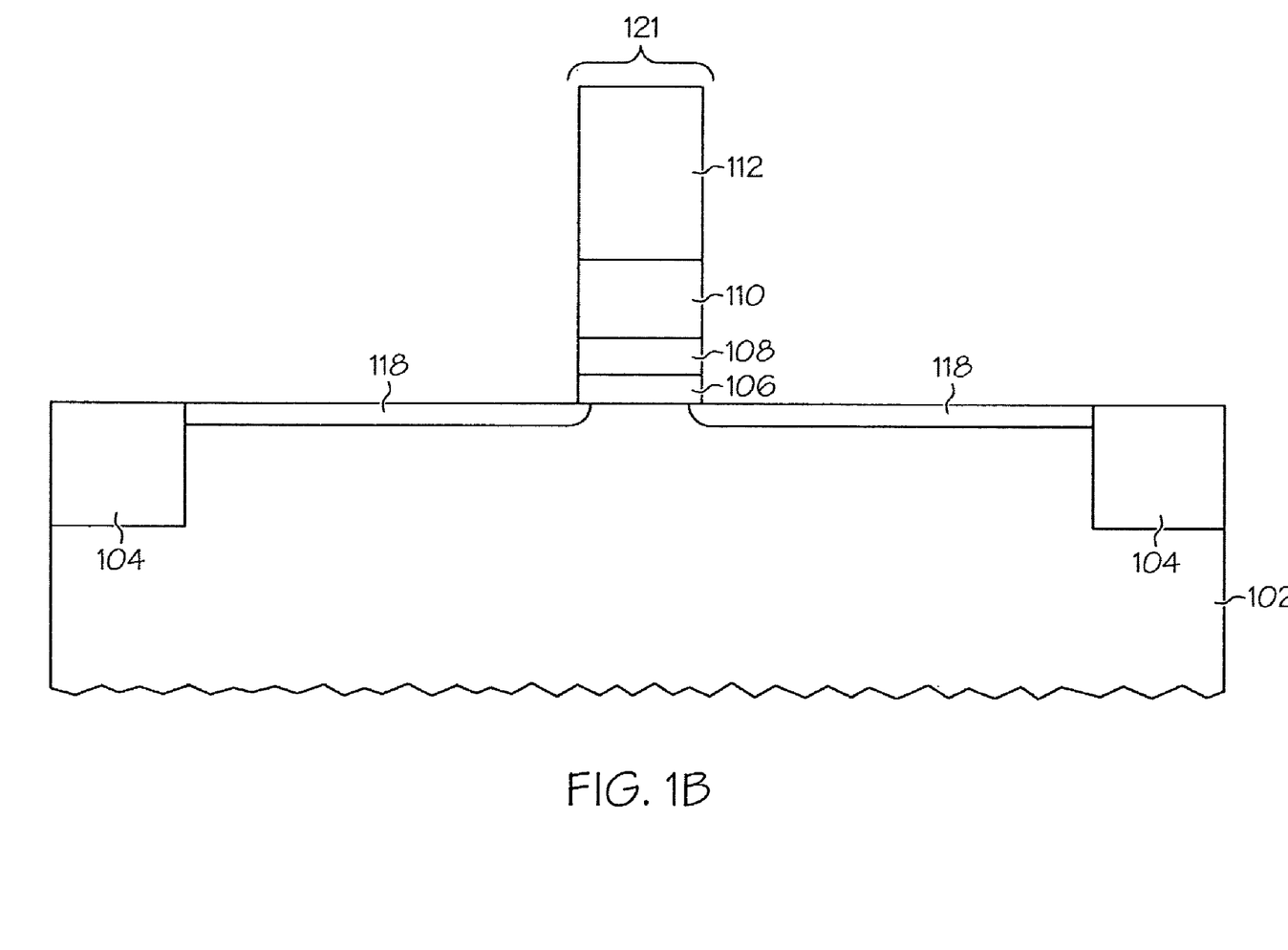
Figure 1C:
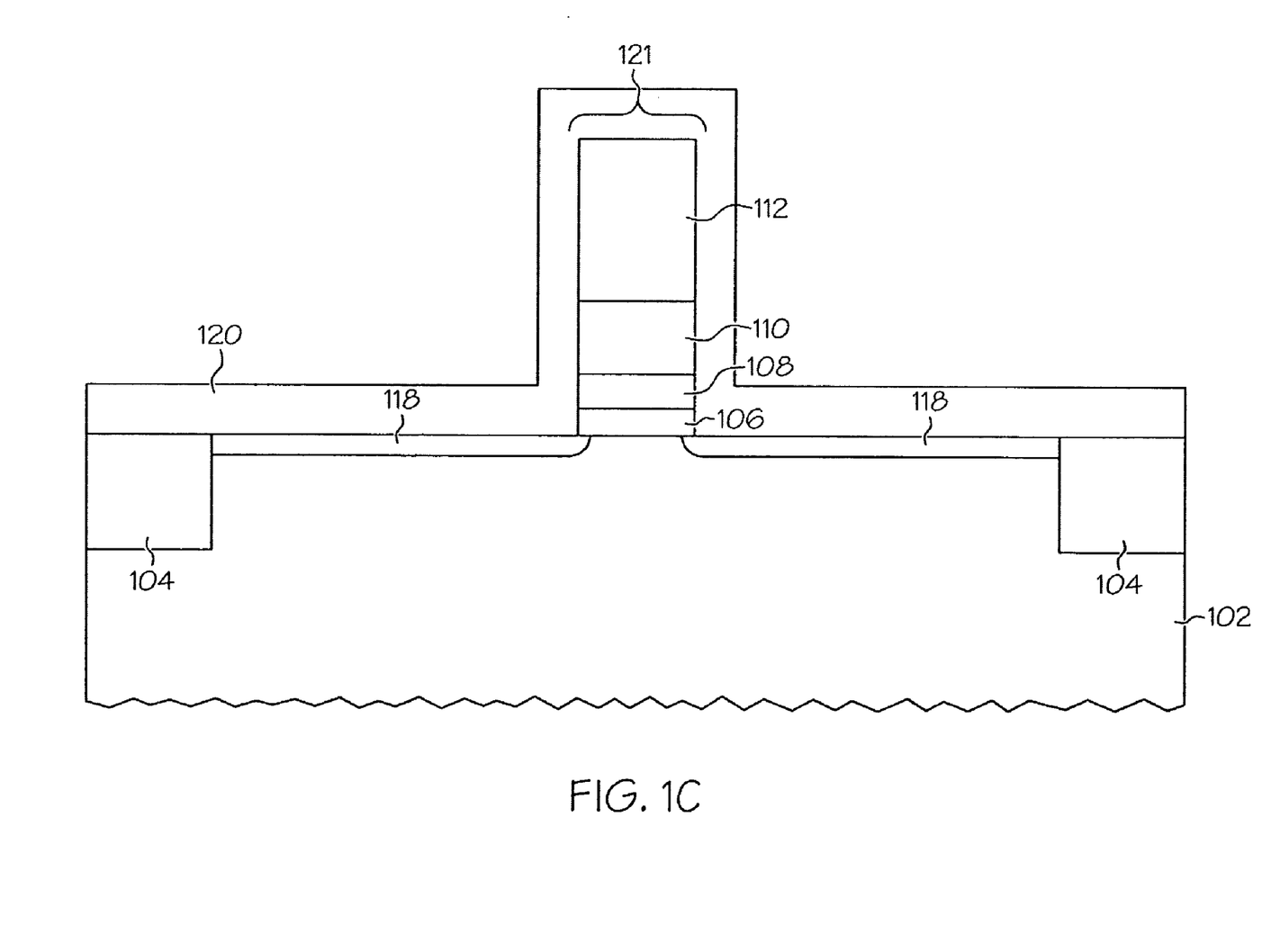

FIG. 1b illustrates the gate stack 121 formed following an etching process such as reactive ion etching (RIE), for example. A dopant implanted close to the surface of the substrate 102 forms shallow diffusion extension area 118 with an off-set spacer (not shown). FIG. 1c illustrates a layer of silicon nitride 120 deposited over the STI 104, the shallow diffusion extension area 118, and the gate stack 121. A thin silicon dioxide layer (not shown) may be deposited under the silicon nitride (120).

Figure 1D:
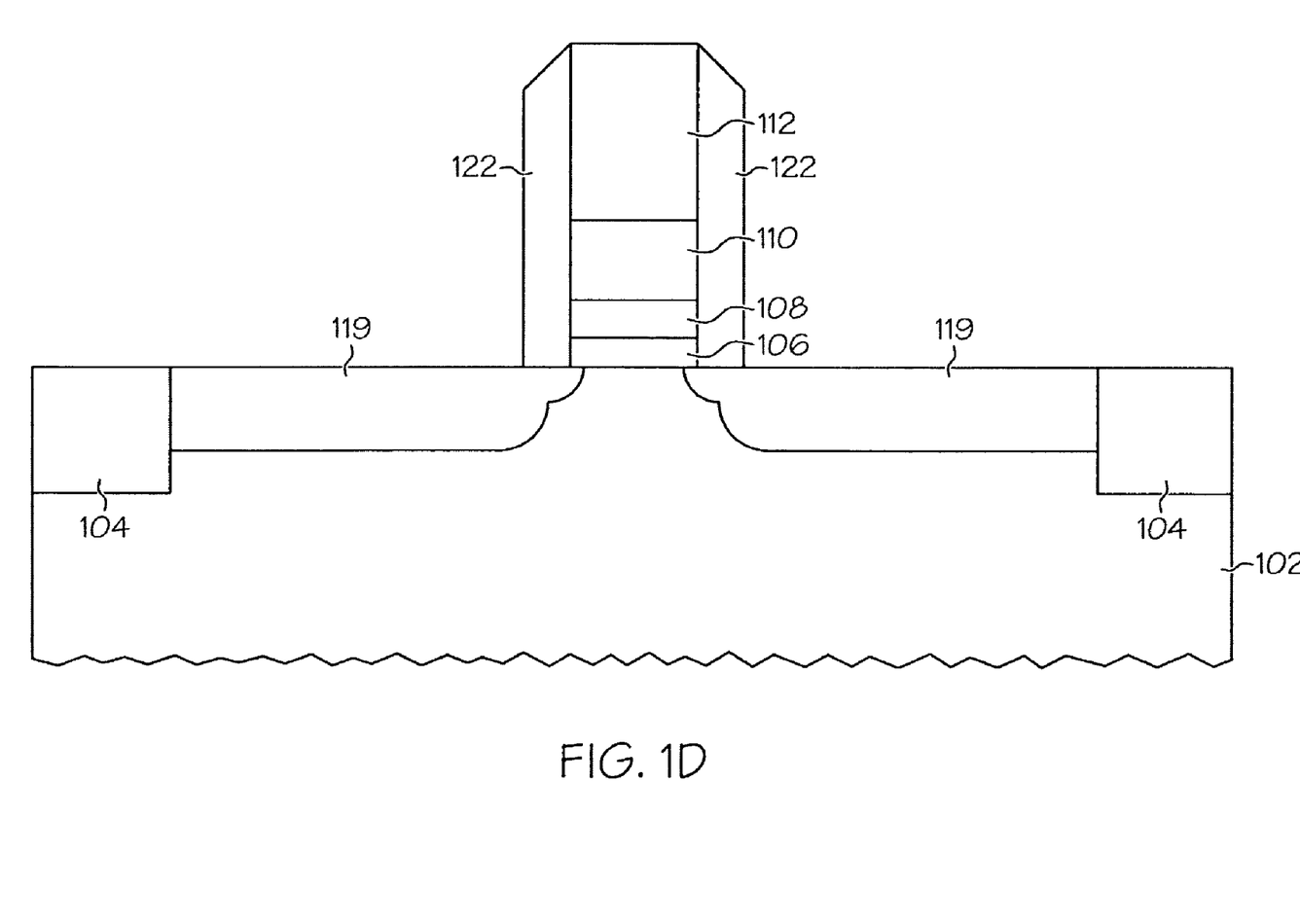

Nitride spacers 122 are formed by depositing conformal silicon nitride layer followed by directional RIE of nitride to etch off the nitride on the horizontal surface leaving the nitride spacer on the vertical surfaces of gate stack. FIG. 1d illustrates the resultant structure including the nitride spacers 122 surrounding the gate stack 121 following etching of the layer of silicon nitride 120. A second ion implantation forms the deep source/drain diffusion areas 119.

Figure 1E:
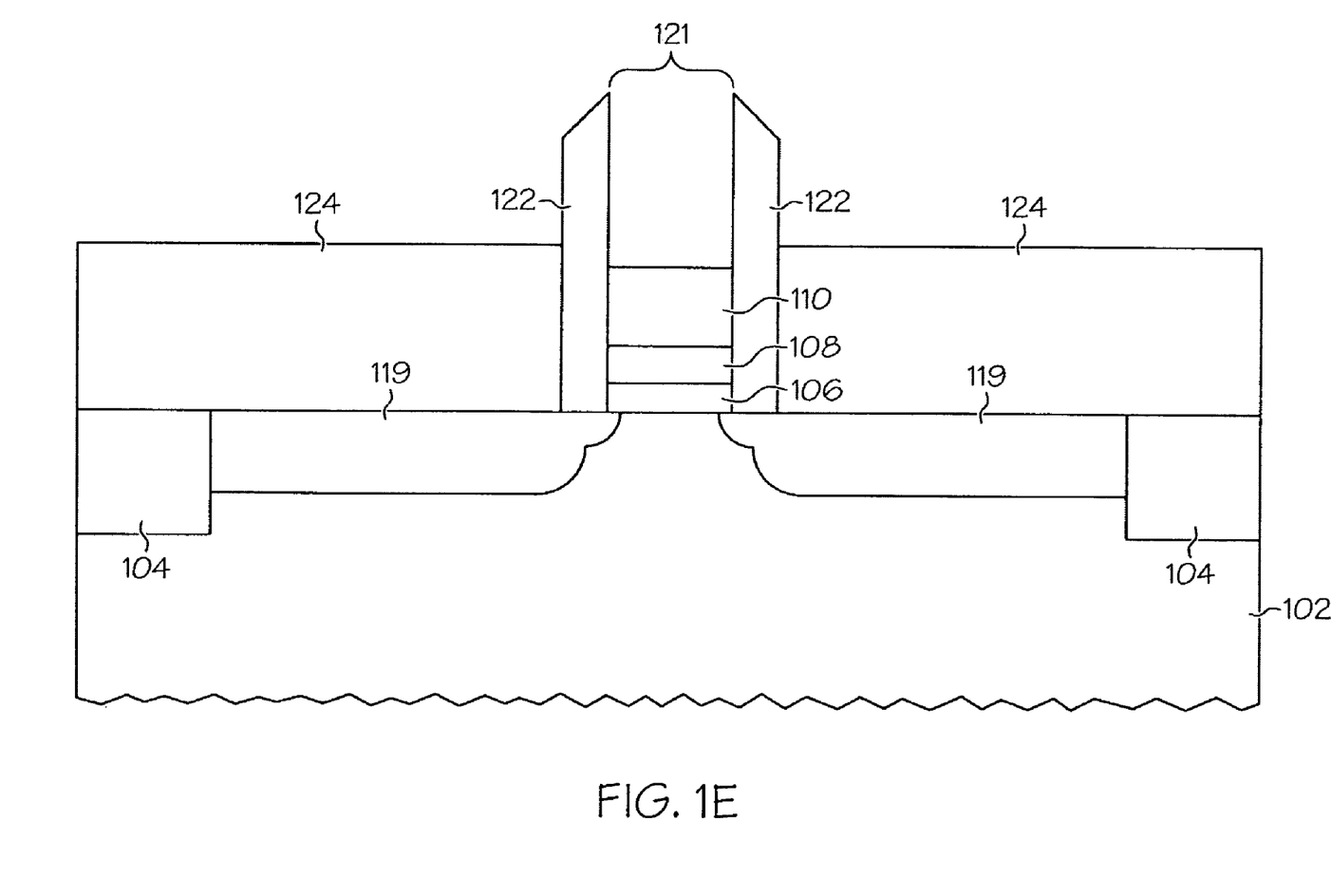

As shown in FIG. 1e, a masking material 124 is deposited over the STI 104, the source drain diffusion area 119, the nitride spacers 122, and the gate stack 121. The masking material may be spin coated and etched back to expose that the nitride spacers 122 and the oxide layer 112 of the gate stack 121. Etching the oxide layer 112 exposes the polysilicon layer 110 of the gate stack 121, as also illustrated in FIG. 1e. This process may be accomplished using any suitable techniques such as plasma enhanced chemical vapor deposition (PECVD) and diluted HF, for example. A suitable etching process such as O₂ plasma etching, for example, removes the masking material 124 after the removal of the oxide layer 112.

Figure 1F:
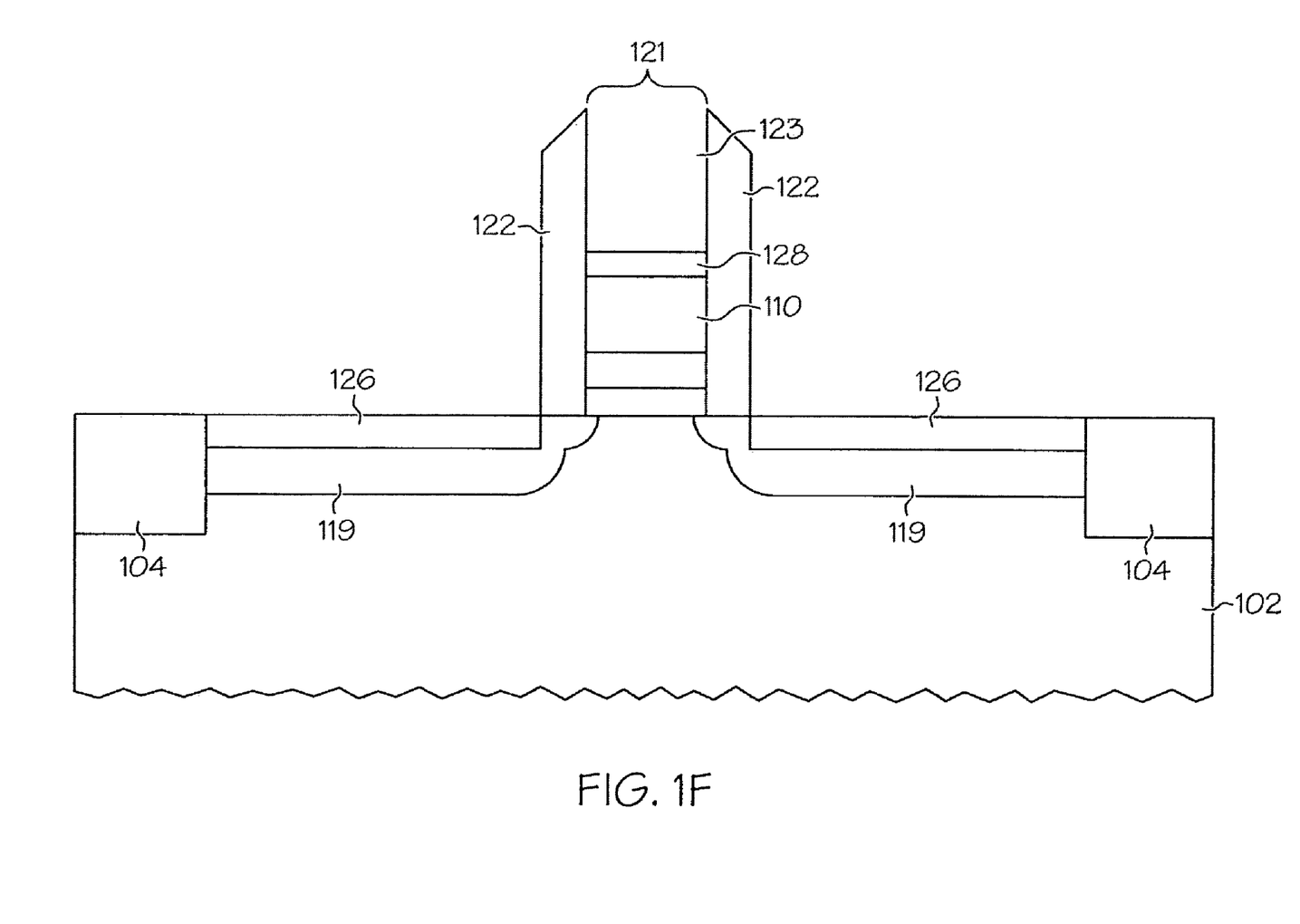

Depositing a layer of refractory metal such as, for example, nickel, and annealing forms a layer of nickel silicide. FIG. 1*f* illustrates the nickel silicide portion 126 in the source drain diffusion area 119 and a nickel silicide portion 128 in the gate stack 121 following annealing of the nickel material.

Figure 1G:
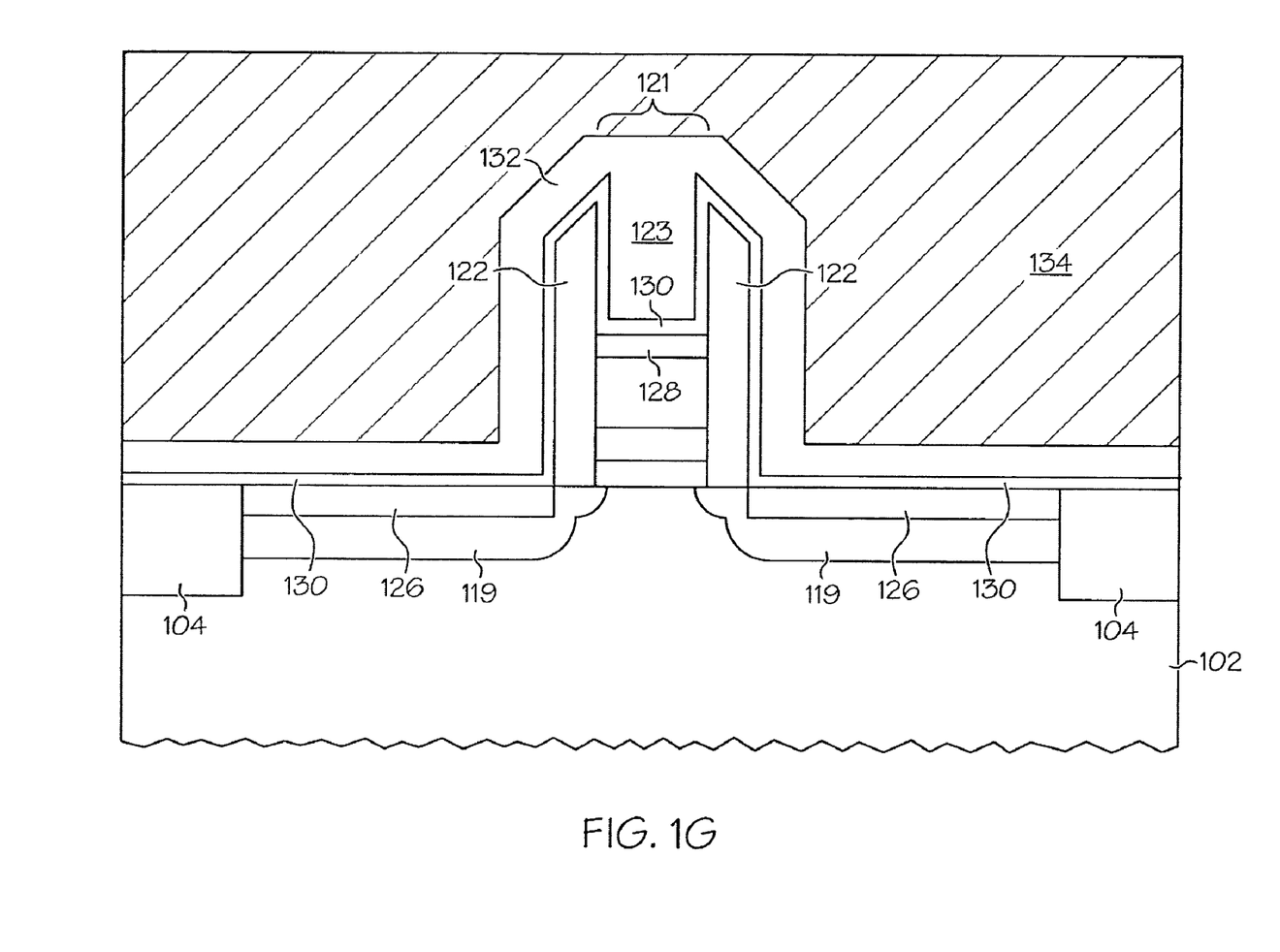

FIG. 1*g* illustrates a relatively thin layer of oxide 130, for example silicon oxide deposited over the entire surface of the device, including the STI 104, the nickel silicide portions 126, and the nickel silicide portion 128 in the gate stack 121. In this exemplary embodiment, the layer of oxide 130 is approximately 10-15 angstroms thick. A thick layer (approximately 50-100 nanometers) of nitride 132 is then deposited over the layer of oxide 130 to act as a stress liner. The layer of nitride 132 substantially fills the volume 123 above the nickel silicide portion 128 of the gate stack 121. A dielectric layer 134 of silicon oxide, for example is deposited over the layer of nitride 132 by PECVD or spin-on techniques, for example.

Figure 1H:
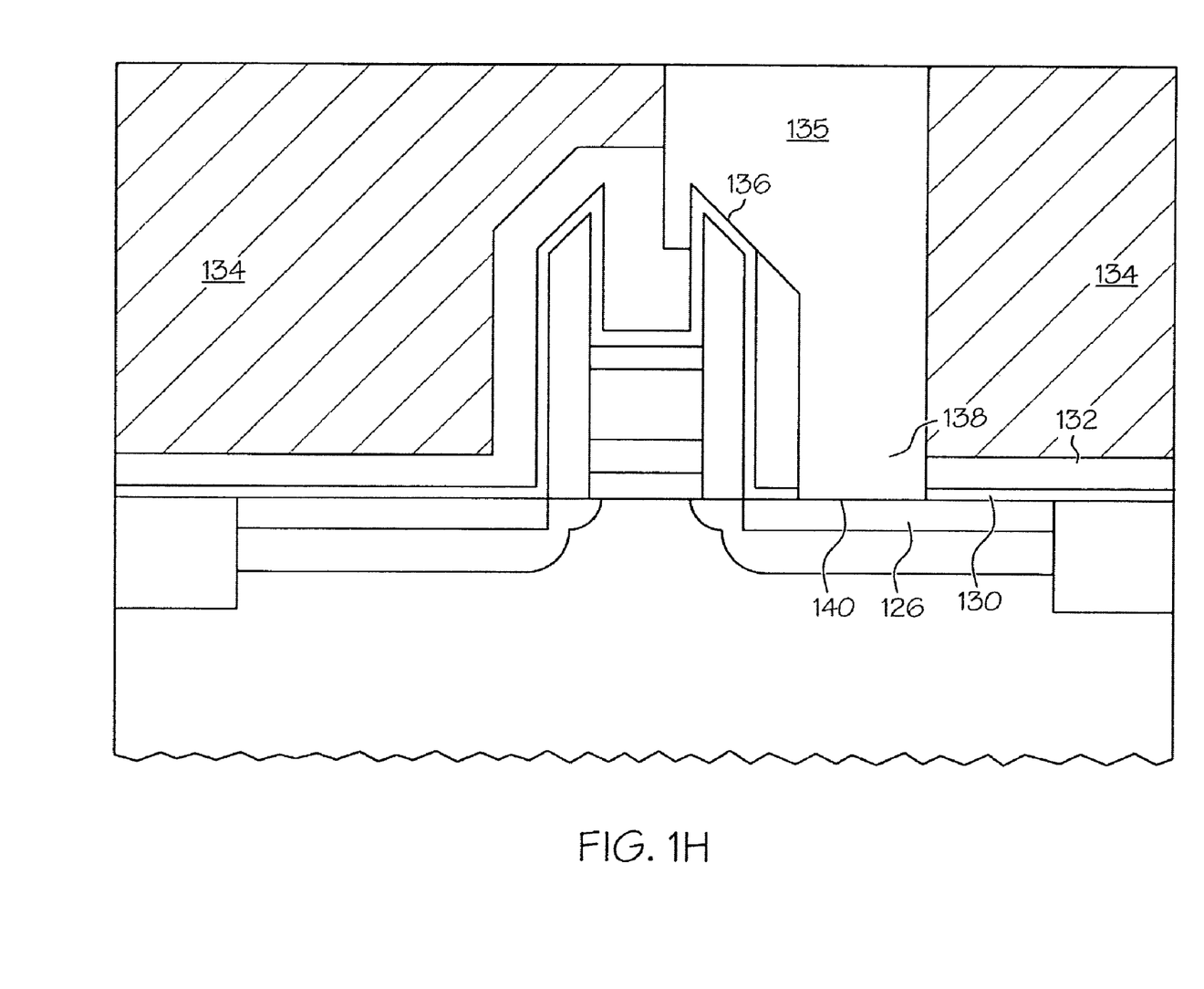

A photo resist (not shown) developed over the dielectric layer 134 defines a contact hole. Etching the dielectric layer 134 using, for example, RIE, forms the contact hole in the dielectric layer 134. FIG. 1*h* illustrates the resultant structure following a second etching process to etch the contact hole 135 through the layer of nitride 132 and layer of oxide 120 such that a contact point 140 is exposed on the nickel silicide portion 126 of the S/D diffusion area.

Figure 1I:
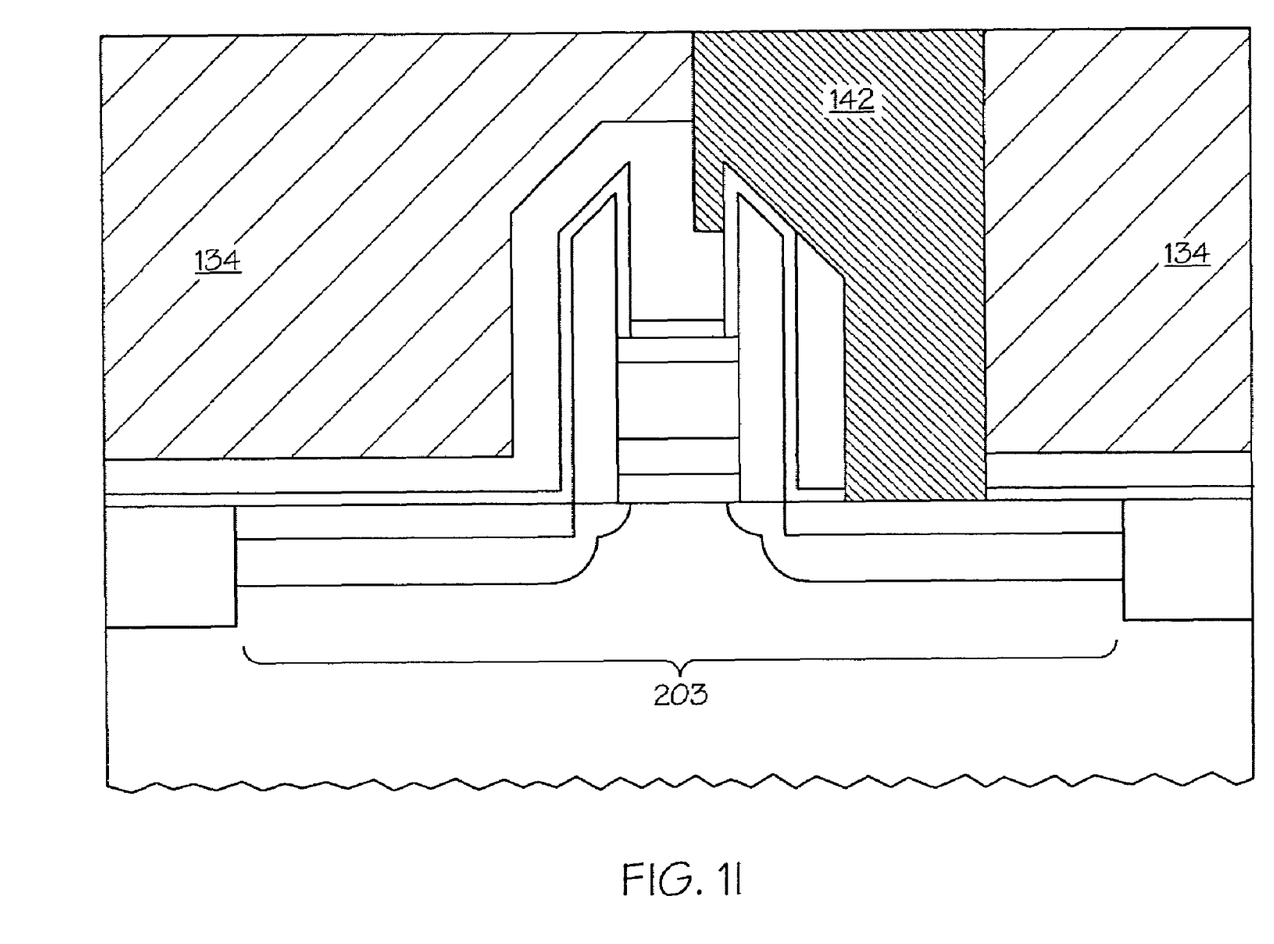

FIG. 1*i* illustrates the resultant electrode contact portion 203 of the structure after a metal contact liner (not shown) and a contact metal 142 such as, for example tungsten, are deposited in the contact hole 135. If necessary, resultant metal overburden (not shown) may be removed, and the surface of the microprocessor may be planarized by a suitable process such as, for example, chemical-mechanical polishing (CMP).

The exemplary method illustrated in FIGS. 1*a*-1*i* allows the fabrication of structures on the substrate 102 without leaving a border space between adjacent gate and the S/D diffusion to allow for misaligned etching of the S/D contact holes. Thus, valuable substrate 102 area may be used for fabricated structures, and is not wasted in accommodating for misalignment.

Figure 2A:
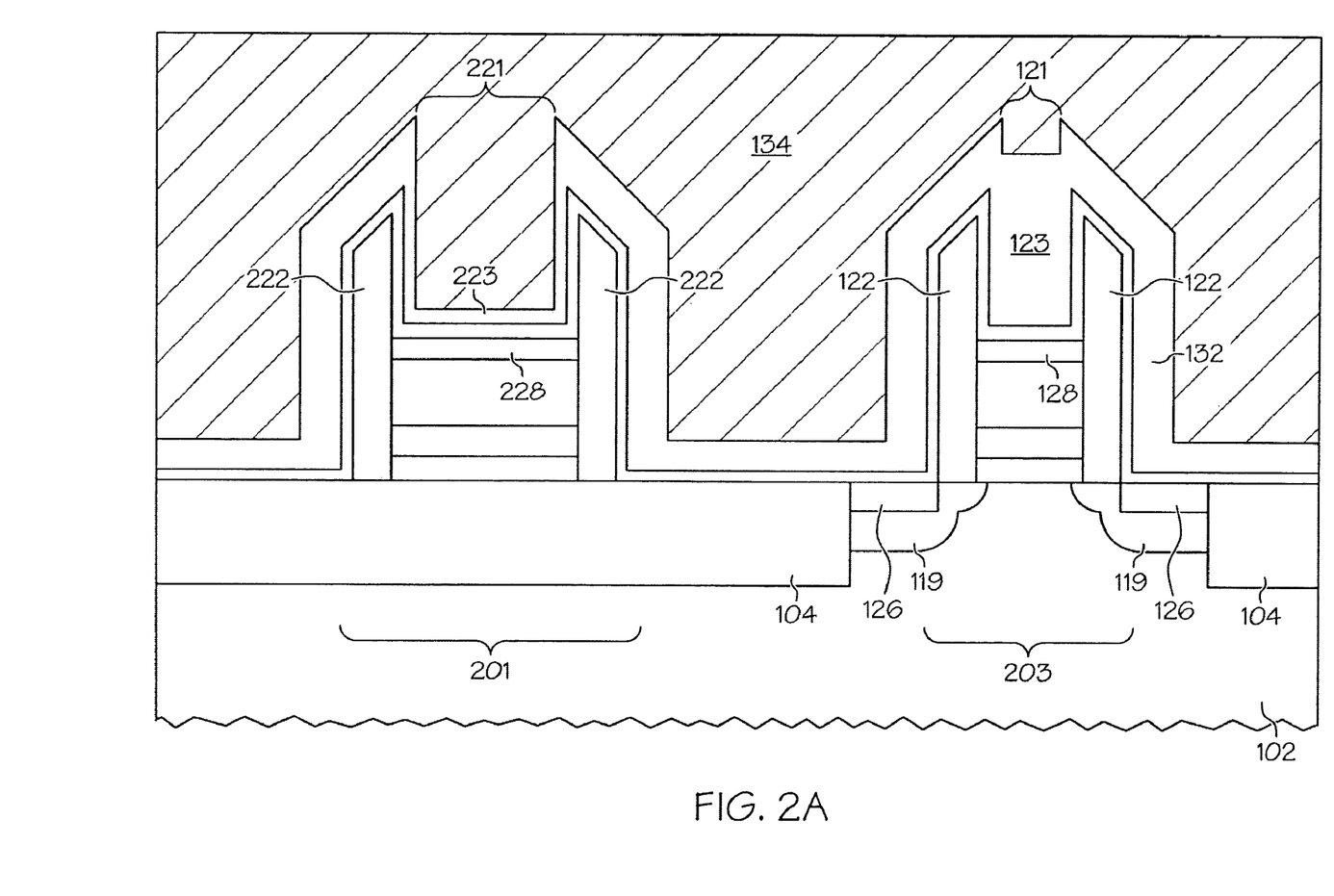
FIGS. 2a-2b illustrate a partially cut-away side view of an exemplary embodiment of a self-aligned contact structure.
Figure 2B:
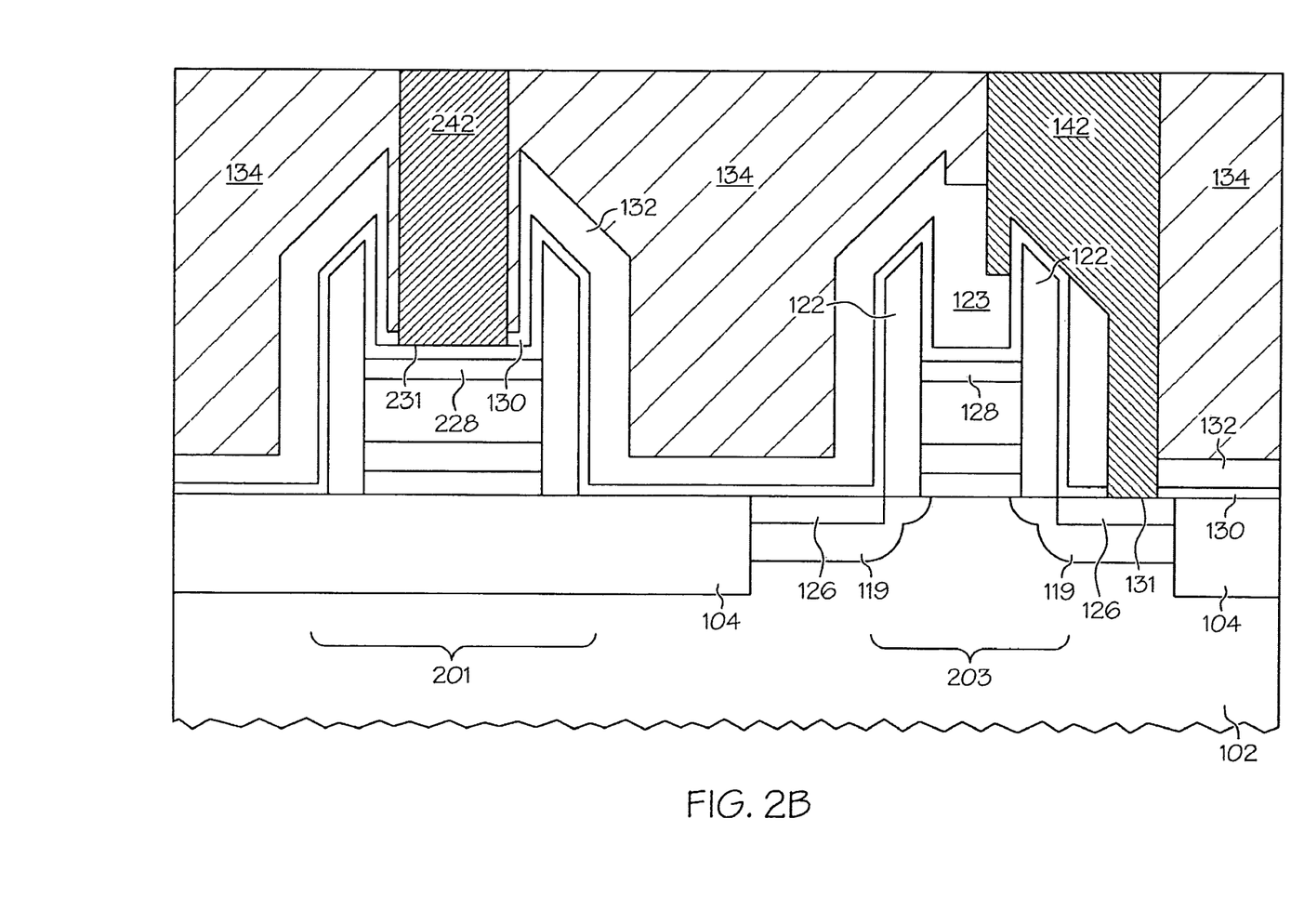

Advantages of the illustrated method may best be explained by referring to FIGS. 2*a* and 2*b*. In this regard, FIG. 2*a* illustrates the resultant structure of a gate contact portion 201 and a gate electrode contact portion 203. The gate electrode portion 203 is similar to the structure illustrated in FIG. 1*g*. In fabrication, the gate contact portion 201 and the gate electrode contact portion 203 may be formed concurrently using similar methods as illustrated in FIGS. 1*a*-1*g*.

Referring to FIG. 2*a*, the distance between nitride spacers 222 in the gate contact portion 201 is greater than the distance between the nitride spacers 122 in the gate electrode portion 203. Thus, a nickel silicide portion 228 of a gate stack 221 is wider than the nickel silicide portion 128 of the gate stack 121. When the nitride layer 132 is deposited over the gate electrode portion 203, the nitride layer 132 substantially fills the volume 123 partially defined by the nitride spacers 122 and the gate stack 121.

In the illustrated exemplary embodiment, the thickness of the nitride layer (132) is thicker than the half distance between the nitride spacers 122 in the gate electrode portion 203 to ensure complete filling the space between the spacers 122. The thickness of the nitride layer 132 is deposited over the gate contact portion 201. The nitride layer is thinner than the half distance between the nitride spacers 222 and results in a layer of nitride in the area 223 between the nitride spacers 222, but is thinner than the nitride that fills the volume 123.

FIG. 2*b* illustrates the structures illustrated in FIG. 2*a* following the etching the contact holes and the depositing of a contact metal. Thus, the gate electrode contact portion 203 illustrated in FIG. 2*b* is similar to the gate electrode contact illustrated in FIG. 1*i*. In this regard referring to FIG. 2*b*, once the contact holes are etched through the dielectric layer 134, an etch to form contact holes through the nitride layer 132 and oxide layer 130 is performed. This etch will define a contact point 131 in the nickel silicide portion 126 of the gate electrode portion 203 and a contact point 231 in the nickel silicide portion 228 of the gate contact portion 201.

Since the etching process will be performed over both the gate contact portion 201 and the gate electrode portion 203, approximately the same amount of the nitride layer 132 will be removed. Thus, nitride layer 132 is removed exposing contact point 231 of the gate contact portion 201, and the nitride layer 132 is removed exposing the contact point 131 of the gate electrode portion 203.

To prevent shorting the gate electrode with the source/drain diffusion area, the contact hole over the gate contact portion 201 should expose the contact point 231 of nickel silicide portion 228, while the contact hole over the gate electrode portion 203 should only expose the contact point 131 of the gate electrode portion 203 without exposing the nickel silicide portion 128. The thickness of the nitride layer 132 in the volume 123 prevents the etch from penetrating the nitride layer 132 in the volume 123, thereby preventing the shorting of the gate circuit.

Thus, by adjusting the height of the nitride spacers 122 and varying their relative distance, the thickness of nitride layer 132 in the volume 123 may be adjusted to compensate for the penetration of the nitride etch. This compensation allows the nitride etch to expose the contact point 131 of the gate electrode portion 203 without shorting the gate circuit, while limiting or eliminating a border of space between structures on the silicon substrate 102.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a borderless contact for a semiconductor FET (Field Effect Transistor) device, the method comprising:

forming a gate conductor stack on a substrate;

forming spacers on the substrate, such that the spacers and the gate conductor stack partially define a volume above the gate conductor stack, wherein the spacers are sized to define the volume such that a stress liner layer deposited on the gate conductor stack substantially fills the volume;

depositing a liner layer on the substrate, the spacers, and the gate conductor stack;

depositing a dielectric layer on the liner layer;

etching to form a contact hole in the dielectric layer;

etching to form the contact hole in the liner layer, such that a portion of a source/drain diffusion area formed in the substrate is exposed, and a portion of the liner layer above the gate conductor stack is removed; and depositing contact metal in the contact hole.

2. The method for forming a borderless contact for a FET semiconductor device of claim 1, wherein the liner layer is a stress liner layer.

3. The method for forming a borderless contact for a FET semiconductor device of claim 1, wherein the spacers are silicon nitride spacers.

4. The method for forming a borderless contact for a semiconductor FET device of claim 2, wherein the stress liner layer comprises silicon nitride.

5. The method for forming a borderless contact for a semiconductor FET device of claim 1, wherein the method of forming the gate conductor stack further comprises:
   forming shallow trench isolation (STI) on the substrate;
   depositing a gate dielectric layer on the substrate;
   depositing a gate conductive layer on the gate dielectric layer;
   depositing a doped polysilicon layer on the gate conductive layer;
   depositing a first silicon dioxide layer on the doped polysilicon layer; and
   etching to form the gate conductor stack.

6. The method for forming a borderless contact for a semiconductor FET device of claim 1, further comprising:
   implanting a first dopant to form a shallow diffusion extension areas; and
   implanting a second dopant to form source/drain diffusion areas.

7. The method for forming a borderless contact for a semiconductor FET device of claim 1, further comprising etching to remove a first silicon dioxide layer of the gate conductor stack prior to filling the volume with the liner layer.

8. The method for forming a borderless contact for a semiconductor FET device of claim 5, further comprising forming a metal silicide layer on the doped polysilicate layer of the gate conductor and the source/drain diffusion areas.

9. The method for forming a borderless contact for a semiconductor FET device of claim 1, further comprising:
   forming a second silicon dioxide layer between the source drain diffusion areas and the stress liner layer; and
   etching to form the contact hole in the oxide layer.

10. A borderless contact structure for a semiconductor FET device comprising:
    a contact area defined on a source/drain diffusion area of a substrate;
    a gate conductor stack disposed on the substrate;
    spacers disposed on the substrate and adjacent the gate conductor stack;
    a volume partially defined by the gate conductor stack and the spacers;
    a liner layer disposed on the contact area, the gate conductor stack, the spacers, and the substrate, wherein the stress liner substantially fills the volume;
    a dielectric layer disposed on the stress liner layer;
    a contact hole formed in the dielectric layer and the liner layer, wherein the formed contact hole exposes the contact area and defines a recess in the liner layer above the gate conductor stack; and
    a contact metal disposed in the contact hole.

11. The structure of claim 10, wherein the liner layer is a stress liner layer.

12. The structure of claim 10, wherein the gate conductor stack comprises:
    a gate dielectric layer;
    a gate conductive layer formed on the gate dielectric layer;
    a doped polysilicon layer formed on the gate conductive layer; and
    a silicide layer formed on the doped polysilicon layer.

13. The structure of claim 10, wherein the spacers comprise silicon nitride.

14. The structure of claim 11, wherein the stress liner layer comprises silicon nitride.

15. The structure of claim 10, further comprising an silicon dioxide layer disposed between the substrate and the liner layer, wherein the formed contact hole is further formed through the oxide layer.

16. The structure of claim 10, wherein the substrate further comprises a shallow trench isolation portion.

17. The structure of claim 12, wherein the gate conductor stack comprises:
    a gate dielectric layer;
    a gate conductive layer formed on the gate dielectric layer, wherein the gate conductive layer is approximately 10-30 nm thick;
    a doped polysilicon layer formed on the gate conductive layer, wherein the doped polysilicon layer is approximately 40-100 nm thick; and
    a silicide layer formed on the doped polysilicon layer.

* * * * *